Figure 1:
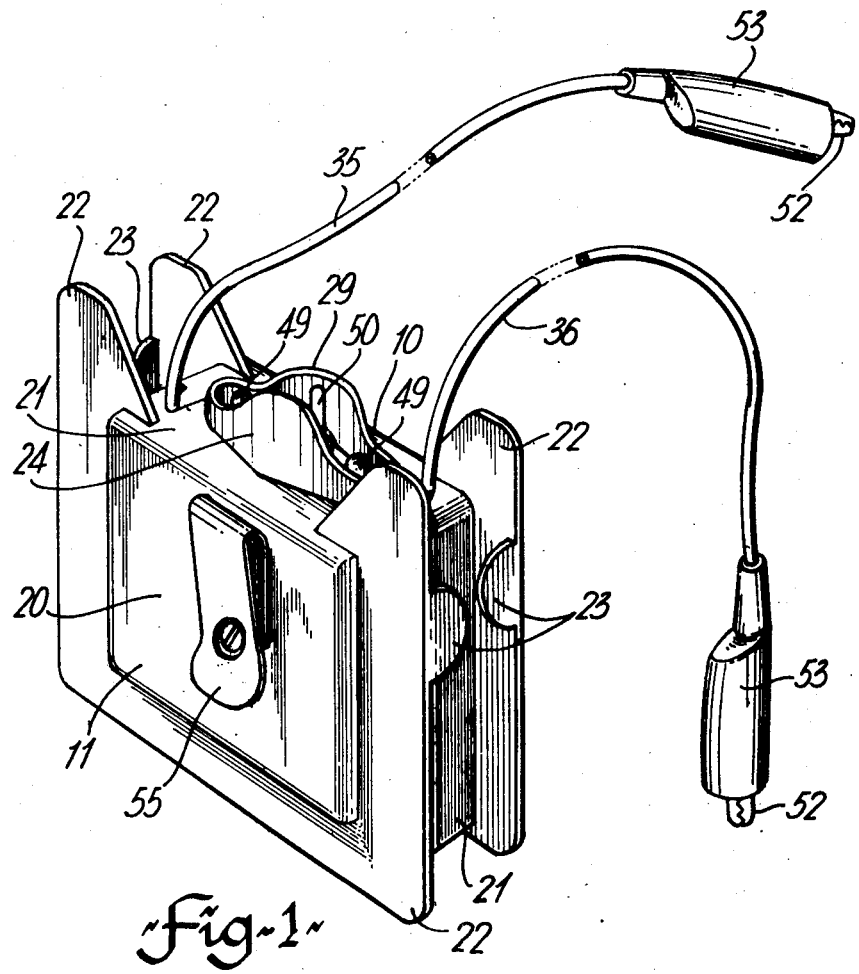

United States Patent [19]
MacCormack et al.

[11] 3,987,364
[45] Oct. 19, 1976

[54] POCKET TEST SET WITH MOULDED CASING FOR TESTING COMMUNICATION CABLES

[75] Inventors: Michael Melville MacCormack, Ottawa; James Hugh Lougheed, Kanata, both of Canada

[73] Assignee: Northern Electric Company Limited, Montreal, Canada

[22] Filed: Jan. 20, 1976

[21] Appl. No.: 650,687

[52] U.S. Cl. .................................. 324/51; 324/156
[51] Int. Cl.[2] ..................................... G01R 31/02
[58] Field of Search ................ 324/51, 52, 66, 133, 324/156, 149, 158 F, 53

[56] References Cited
UNITED STATES PATENTS

| | | | |
|---|---|---|---|
| 1,433,264 | 10/1922 | Fahlenberg | 324/51 |
| 2,581,497 | 1/1952 | Podell | 324/51 |
| 2,586,203 | 2/1952 | Boyle | 324/149 X |
| 3,214,689 | 10/1965 | Outen | 324/51 |
| 3,535,638 | 10/1970 | Michelin | 324/51 X |
| 3,555,420 | 1/1971 | Schwartz | 324/149 |

*Primary Examiner*—Gerard R. Strecker
*Attorney, Agent, or Firm*—Sidney T. Jelly

[57] ABSTRACT

A test set, as used for indicating line conditions and line identification for telecommunication cables for example, has a casing formed from two identical mouldings. A rib and groove seal is provided for the mating surface by forming a rib on half the mating surface and a groove on the other half. Laterally extending webs form a channel in which the leads of the test set are wound when not in use. Ears on the webs extending towards each other form constrictions which maintains the leads in the channel. At the top of the casing, arcuate webs provide a protected region in which are situated a toggle switch and indicator lamps. Inside the casing, formations hold a printed circuit board and define a compartment for a battery.

8 Claims, 6 Drawing Figures

3,987,364

POCKET TEST SET WITH MOULDED CASING FOR TESTING COMMUNICATION CABLES

The present invention relates to a test set, particularly for telecommunications cables and in particular to a pocket test set for indicating line conditions and for line identification.

Test sets are used for various purposes. For example a test set can be used to trace conductor pairs which cannot be traced readily by sight, make continuity tests for opens and shorts on conductor pairs; identify various line conditions on working lines and identify tip and ring; tracing concealed wires. It is also useful to be able to supply talk battery for communicating between two or more terminations of wire or cable.

When connecting a test set to a pair of lines it should be possible to detect whether the lines are in use, on ring or on battery. It is particularly useful to be able to tell a line condition if a tone signal is to be imposed on a pair of conductors, for identification purposes for example, as the imposing of such a signal on a pair of conductors is to be avoided while the lines are in use.

It is desirable that the test set be compact, sturdy, easily handled, cheap and easy to manufacture and reliable. The test set in accordance with the present invention is very economical to make in that two identical moldings are used for the housing – reducing die costs. Formations are provided to retain leads from the test set in a wound up position when the set is not being used and also protection for a switch and indicators is provided. The test set can readily be carried in a pocket, although a belt clip can be provided if desired.

Thus, in accordance with the present invention, a test set includes a hollow case composed of two identical moldings, each molding comprising a flat base web, a wall extending around the periphery of the base web and normal thereto, the wall having a base portion, side portions and a top portion and an outer edge remote from the base web and extending peripherally of the molding, a joint face on the outer edge, the joint face facing away from the base web, a flange extending outwards from the wall at a position intermediate the base web and the outer edge, the flange including base and side portions extending respectively along the base portion and side portions of the wall respectively, a hollow boss integral with the base web and extending approximately centrally in the same direction as the wall, recesses in the top portion of the wall, recesses extending from the joint face and positioned in a central part of the top portion and symmetrical about a centre line of the molding, an arcuate web extending outwards from the top portion of said wall, each end of the arcuate web coincident with the joint face and enclosing the central part of the top portion of the wall, two further recesses in the top portion of the wall, a recess on each side of the central part and outside the arcuate web, and a thin web extending from the periphery of the flange in each side portion thereof, and extending in a direction normal thereto, the thin webs extending parallel to the side portion of the wall and positioned toward the top of the side portions of the flange and extending a distance slightly less than the distance extending by the wall; the two moldings assembled together with the joint faces in contact, the recesses in the top portions of the walls in opposition and the thin webs extending towards each other, separated by a distance slightly less than the diameter of the leads; an electronic circuit assembly positioned in the housing, a switch and at least one indicator light positioned in the recesses in the central part of the top portion of the wall, and two leads each attached at one end to the electronic circuit assembly, the leads extending through the two further recesses in the top portion of the wall, a lead in each recess, the switch, indicator light and leads connected to the circuit, the arrangement such that when not in use the leads can be wrapped round said hollow case between said flanges, the leads pulled down between said thin webs and retained in position thereby, said arcuate webs cooperating to protect and shield said switch and said indicator light.

Figure 3:
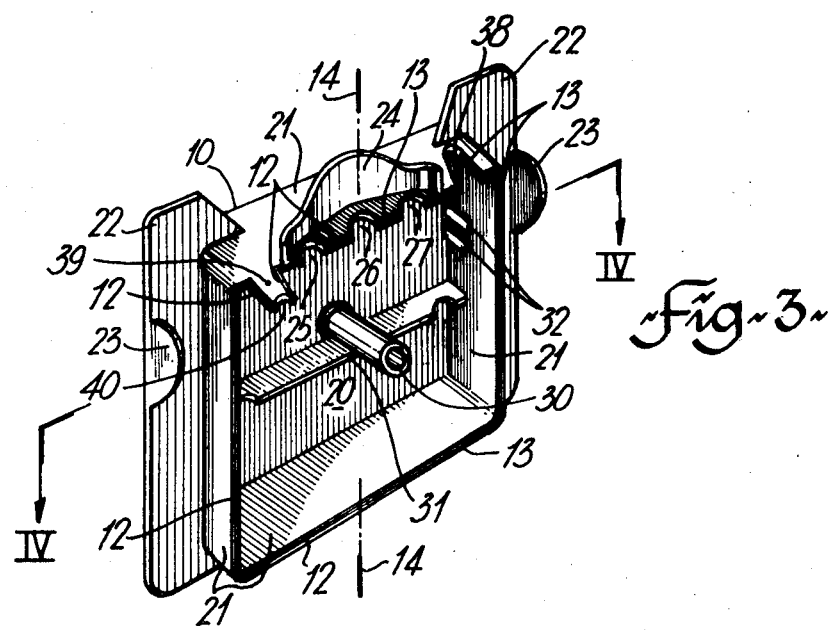
Figure 2:
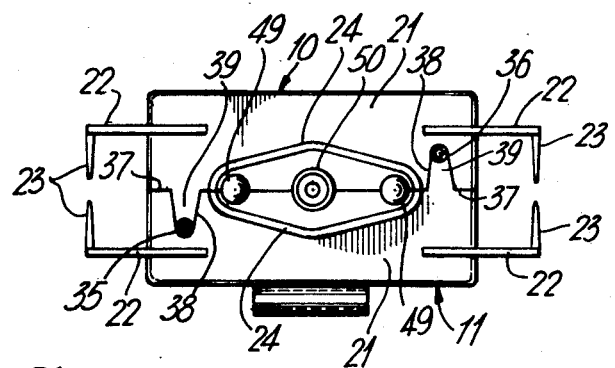
Figure 5:
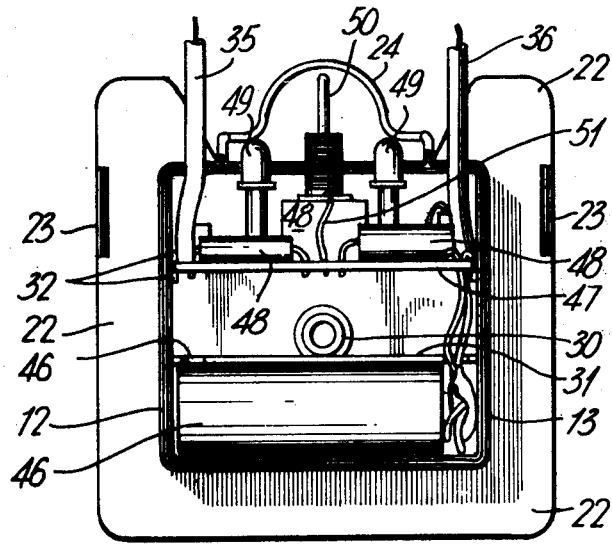
Figure 6:
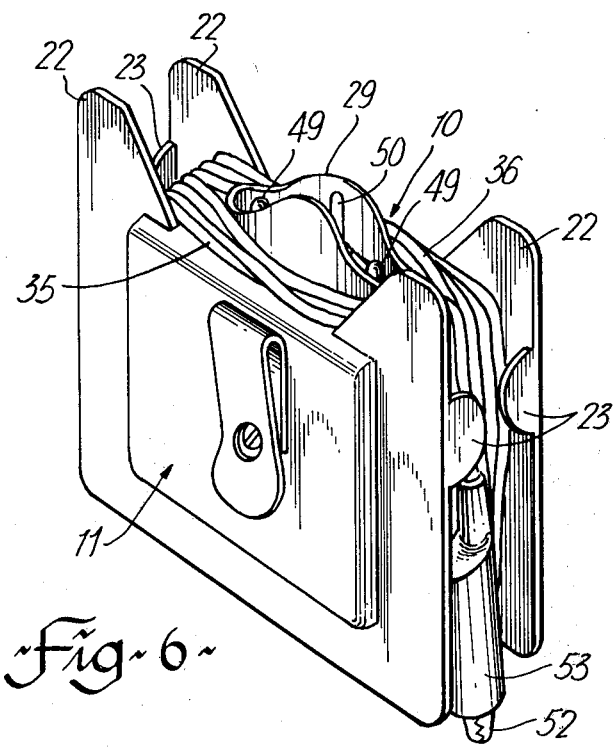
Figure 4:
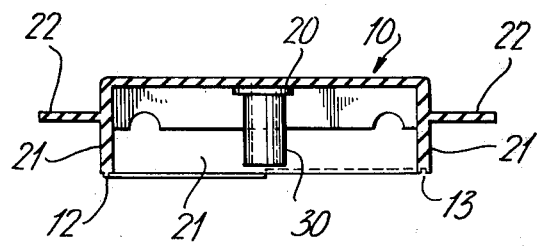

The above described, and other conveniences and advantages will be apparent by the following description of a particular embodiment, by way of example, in conjunction with the accompanying drawings, in which:

FIG. 1 is a perspective view of an assembled test set;
FIG. 2 is a top plan view of the test set of FIG. 1;
FIG. 3 is a perspective view of a casing half;
FIG. 4 is a cross-section on the line IV-IV of FIG. 3;
FIG. 5 is a front view of the test set of FIGS. 1 and 2 with the front casing half removed to show the electrical items;
FIG. 6 is a perspective view of a test set, with leads wound up.

As illustrated in FIGS. 1 and 2 a test set comprises two moldings 10 and 11 which combine to form a hollow housing or case. The moldings 10 and 11 are identical so that only one molding die is required. To provide for correct relative positioning of the moldings relative to each other, and to provide a degree of sealing cooperating ribs and grooves are formed on the mating edges. This is done, as seen in FIG. 3, and FIG. 4, by forming ribs on one half of each molding indicated at 12, and grooves on the other half, as indicated at 13. Thus, considering a molding about a vertical axis 14, the rib and groove formations are complimentary about this axis.

Considering a molding in more detail, as in FIGS. 3 and 4, it comprises a box-like structure having a flat base web 20 with a wall 21 extending around the periphery of the base web and normal thereto. Extending approximately three quarters of the way round the outer periphery of the wall 21, for each side portion and a bottom portion, is a flange 22, the flange extending normal to the wall, that is in a plane parallel to the plane of the base web 20. Towards the upper part of each side portion of the flange 22 a thin web or "ear" 23 extends forward from the periphery of the flange.

At the top of the molding, extending normal to the top portion of the wall 21, is a web 24. Web 24 is curved when viewed from the top, that is in a direction parallel to the plane of the base web 20, and is also of a curved configuration when viewed from the front. This is seen quite clearly in FIG. 3. Three semicircular recesses 25, 26 and 27 are formed in the top portion of the wall 21 and are within the area enclosed by the web 24 being disposed symmetrically about a centre line of the molding. The recesses extend from the edge of the molding.

A hollow boss 30 is provided at the centre of the base web 20 and a shallow rib 31 extends across the interior of the housing just below the boss 30. On each side portion of the wall 21, a short distance above the boss 30 are two closely spaced ribs 32 for holding a printed circuit board, as will be described. The boss 30, in the present example is slightly shorter than the depth of the molding, as seen in FIG. 4. Firstly this ensures that the two halves are tightly assembled together, and also, with the resulting slight deformation of the moldings when assembled and held together by a screw passing through the bosses and retained by a nut. Also, there is room for a retaining washer to be pressed onto the screw to make the screw captive. The nut is also captive by being a tight fit in a recess in the outer end of the boss in one molding. The screw head is a loose fit in the corresponding recess in the other molding.

As seen in FIG. 1, two leads 35 and 36 extend from the housing. Considering FIG. 2, it will be seen that these leads in the particular example, are arranged to exit on either side of the plane of the joint line 37 (FIG. 2). This is obtained by providing a recess 38 in the top portion of the wall 21 of a molding, as in FIG. 3, with a complimentary extension 39 at the other end of the top portion of the wall 21. The recess 38 has a semicircular end and the extension 39 has a semicircular recess 40 at its outer end. The ribs 12 extend along the edges of the extension 39 and the grooves 13 extend along the edges of the recess 38.

Prior to assembly of the two moldings to form a complete housing, the electrical items are assembled into one of the moldings. This is illustrated in FIG. 5. Situated in the lower part of the molding, below the shallow rib 31, is a battery 45. A printed circuit board 47 carrying various electronic items 48, two light emitting devices 49 and a switch 50 is slid into place, the ends of the board fitting between the pairs of closely spaced ribs 32. The leads from the battery pass up to the board. The light emitting devices 49 project up and are positioned in the recesses 25 and 27 in the top portion of the wall 21 and the switch 50 fits into the recess 26, between recesses 25 and 27. The leads 35 and 36 extend through the deep recesses 38. In the initial assembly into one molding, one lead, for example lead 36, will be in a recess 38, while the other lead will rest in the recess 40 at the end of the extension 39.

The second molding is applied to the first molding, the extension 39 of one molding entering the recess 38 of the other molding. The ribs 12 on the moldings will enter the grooves 13 and the closely spaced ribs 32 of the second molding will engage with the printed circuit board 47. The shallow rib 31 of the second molding will also be positioned over the battery retaining it in place. The ribs 31 need not be continuous across the molding and other ways of retaining the battery in position can be provided. The light emitting devices 49 and switch 50 are held firmly in place by the cooperation of the recesses 25, 26 and 27 in the two moldings.

The leads 35 and 36 are provided at their ends with clips 52 having flexible shields 53. When the test set is not in use the leads are wrapped around the housing, the leads positioned between the flanges 22. When the two moldings 10 and 11 are assembled together - held together by the screw and a nut - the thin webs or "ears" 23 extend toward each other to leave a gap which is about the same dimension as, or slightly smaller than, the diameter of the lead 35 or 36. Thus as the leads are wound round the housing the leads clip down between the webs 23.

Preferably the leads 35 and 36 are wrapped in opposite directions.

The webs 24 protect the light emitting devices 49 and the switch 50 and particularly tend to prevent a lead being wrapped directly over the switch - actuating the switch and possibly draining the battery. This protection is further improved by bringing the leads out of the housing offset - by means of the recesses 38 and extensions 39. This offset assists in tending to cause the leads to pass outside the webs 24. However, if desired the leads can be brought out on the joint line by providing small recesses in the moldings, similar to the recesses 25, 26 and 27. The lengths of the leads is arranged such that the clips 52 are held captive by the webs 23 when the leads are wound onto the housing.

As stated it is useful to be able to supply talk battery for communicating between two or more terminations. This has previously been provided by the addition of a third lead. In the present set, this third lead has been avoided by providing an electrical connection to the bridge of the switch 50. This connection is shown at 51 in FIG. 5. A series resistor is used to limit the current. The user of the set connects one lead of his headset to the toggle of the switch 50, instead of having to connect to the third lead.

Additional to protecting the light emitting devices and switch, the webs 24 act as a shield to provide shading in high ambient light conditions. This improves visibility of the light emitting devices, which, in a particular example are light emitting diodes. A simple toggle switch can be used and is protected. The printed circuit board is securely held and well isolated from the battery.

The unit is lightweight and can be suspended, in use, by the leads. The unit is small enough to fit in a user's shirt pocket. The leads are neatly and securely held in place when wound up and disconnect'on of the leads is not necessary, nor is a separate case or cover required. A belt clip 55 can be provided if desired.

What is claimed is:

1. A test set including a hollow case composed of two identical moldings, each molding comprising:

a flat base web;

a wall extending around the periphery of the base web and normal thereto, said wall having a base portion, side portions and top portion and an outer edge remote from the base web and extending peripherally of said molding;

a joint face on said outer edge, said joint face facing away from said base web;

a flange extending outwards from said wall at a position intermediate the base web and said outer edge, said flange including base and side portions extending respectively along said base portion and side portions of said wall;

a hollow boss integral with said base web and extending from said base web approximately centrally thereof in the same direction as said wall;

recesses in said top portion of said wall, said recesses extending from said joint face and positioned in a central part of said top portion and symmetrical about a centre line of said molding;

an arcuate web extending outwards from said top portion of said wall, each end of said arcuate web coincident with said joint face, said arcuate web enclosing said central part of said top portion of said wall;

two further recesses in said top portion of said wall, a recess on each side of said central part and outside said arcuate web; and a thin web extending from the periphery of said flange on each side portion thereof, and extending in a direction normal thereto, the thin webs extending parallel to the side portion of said wall, said thin webs positioned toward the top of said side portions of the flange and extending a distance slightly less than the distance extended by said wall;

said two moldings assembled together with said joint faces in contact, said recesses in said top portions of said walls in opposition and said thin webs extending towards each other, separated by a distance slightly less than the diameter of said leads;

an electronic circuit assembly positioned in said housing;

a switch and at least one indicator light positioned in said recesses in said central part of said top portion of said wall, and two leads each attached at one end to said electronic circuit assembly, said leads extending through said two further recesses in said top portion of said wall, a lead in each recess, said switch indicator light and leads connected to said circuit;

the arrangement such that when not in use the leads can be wrapped round said hollow case between said flanges, the leads pulled down between said thin webs and retained in position thereby, said arcuate webs cooperating to protect and shield said switch and said indicator light.

2. A test set as claimed in claim 1, including a rib extending along said joint face for half the periphery of the molding and a complimentary groove extending along said joint face for the other half of the periphery of the molding, the arrangement such that in the assembled case, the rib on one molding is seated in the groove of the other molding.

3. A test set as claimed in claim 1, said electronic circuit assembly comprising a printed circuit board, and two parallel closely spaced ribs on an inner surface of each side portion of said wall, said ribs extending normal to said base web, an end of said printed circuit board engaged between each pair of said parallel webs.

4. A test set as claimed in claim 3, said parallel webs positioned above said hollow boss, said printed circuit board extending across the case above said bosses, and means for positioning a battery in said case below said bosses.

5. A test set as claimed in claim 1, including three recesses in said top portion of said wall in said central part of said top portion and comprising a central and two side recesses, said switch positioned in said central recess and an indicator light positioned in each one of the side recesses.

6. A test set as claimed in claim 1, said switch including an electrically conductive actuating member extending from said case, and an electrical connection to said actuating member from said battery.

7. A test set as claimed in claim 1, including contact clips on the ends of said leads, said contact clips positioned adjacent said thin webs when said leads are wrapped round said case and retained between said flanges.

8. A test set as claimed in claim 1, said further recesses offset from said joint face, one of said reccesses including a semicircular end offset from said joint line toward said base web, the other of said recesses a semicircular recess at an extremity of an extension from said joint face, said recesses symmetrical about said centre line of said molding;

the arrangement such that said extension of one molding is positioned in said one of said recesses of the other molding, to define two apertures, said leads extending through said apertures and offset one on each side of said joint face.

* * * * *